(12) United States Patent
Chi

(10) Patent No.: US 8,493,041 B2
(45) Date of Patent: Jul. 23, 2013

(54) SYSTEM AND METHOD FOR TERMINATION POWERED DIFFERENTIAL INTERFACE PERIPHERY

(75) Inventor: Hongwu Chi, Sunnyvale, CA (US)

(73) Assignee: Analogix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 13/434,270

(22) Filed: Mar. 29, 2012

(65) Prior Publication Data

US 2012/0182480 A1    Jul. 19, 2012

Related U.S. Application Data

(63) Continuation of application No. 11/800,861, filed on May 7, 2007, now Pat. No. 8,175,555.

(51) Int. Cl.
*H05F 1/00* (2006.01)

(52) U.S. Cl.
USPC ......................................................... 323/268

(58) Field of Classification Search
USPC . 323/220, 234, 268; 326/82, 83, 86; 327/538, 327/540, 541; 455/91–129
See application file for complete search history.

(56) References Cited

U.S. PATENT DOCUMENTS

| | | | |
|---|---|---|---|
| 3,959,772 A | 5/1976 | Wakasa et al. | |
| 4,476,535 A | 10/1984 | Loshing et al. | |
| 4,964,140 A | 10/1990 | Yonekura | |
| 5,281,873 A | 1/1994 | Seki | |
| 5,842,140 A | 11/1998 | Dent et al. | |
| 5,898,297 A | 4/1999 | Bosnyak et al. | |
| 5,907,264 A * | 5/1999 | Feldman | 332/103 |
| 5,932,123 A | 8/1999 | Marhofer et al. | |
| 6,292,901 B1 | 9/2001 | Lys et al. | |
| 6,720,745 B2 | 4/2004 | Lys et al. | |
| 6,731,132 B2 | 5/2004 | Aloisi | |
| 7,127,623 B2 | 10/2006 | Potega | |
| 7,138,992 B2 | 11/2006 | Nakamura | |
| 7,141,958 B2 | 11/2006 | Saitoh | |
| 7,142,480 B2 | 11/2006 | Chamberlain | |
| 7,145,541 B2 | 12/2006 | Kurokawa et al. | |

(Continued)

FOREIGN PATENT DOCUMENTS

EP    1318601    6/2003
WO    0045558    8/2000

OTHER PUBLICATIONS

Freed, Adrian, "Bi-directional AES/EBU Digital Audio and Remote Power Over a Single Cable", CNMAT, UC Berkeley, Berkeley, California, (1999), pp. 1-6.

(Continued)

*Primary Examiner* — Adolf Berhane
*Assistant Examiner* — Yemane Mehari
(74) *Attorney, Agent, or Firm* — Carr & Ferrell LLP

(57) ABSTRACT

An apparatus and method for supplying power to the peripheral circuits of a transmitter circuit, especially an HDMI transmitter circuit, is disclosed. In an HDMI transmitter, the termination resistors of the output driver are part of the receiver. DC power for the driver is supplied through these termination resistors. In prior art implementations, power supplied by the receiver circuit is wasted in the DC set-up circuit of the differential line driver. In various embodiments, this wasted power may be recovered from the remote termination to power selected peripheral circuits of the transmitter. The use of this wasted power may reduce the total system power consumption.

14 Claims, 3 Drawing Sheets

U.S. PATENT DOCUMENTS

| | | |
|---|---|---|
| 7,149,644 B2 | 12/2006 | Kobayashi et al. |
| 7,154,761 B1 | 12/2006 | Camerlo et al. |
| 7,154,981 B2 | 12/2006 | Tokuhiro et al. |
| 7,158,003 B2 | 1/2007 | Cern et al. |
| 7,158,563 B2 | 1/2007 | Ginis et al. |
| 7,269,673 B2 | 9/2007 | Kim et al. |
| 7,446,567 B2 | 11/2008 | Otsuka et al. |
| 7,511,515 B2 | 3/2009 | Herbold |
| 7,583,033 B2 | 9/2009 | Ikeda |
| 7,712,976 B2 | 5/2010 | Aronson et al. |
| 8,035,359 B2 | 10/2011 | Chi |
| 2003/0210074 A1 | 11/2003 | Morgan et al. |
| 2005/0007162 A1* | 1/2005 | Torres ............... 327/108 |
| 2006/0005055 A1 | 1/2006 | Potega |
| 2006/0145954 A1 | 7/2006 | Kubota et al. |
| 2006/0284649 A1 | 12/2006 | Cho et al. |
| 2006/0287763 A1 | 12/2006 | Ochi et al. |
| 2006/0291493 A1 | 12/2006 | Schley-May et al. |
| 2006/0291575 A1 | 12/2006 | Berkman et al. |
| 2007/0291938 A1 | 12/2007 | Rao et al. |
| 2008/0278122 A1 | 11/2008 | Chi |
| 2008/0278224 A1 | 11/2008 | Chi |
| 2009/0189442 A1 | 7/2009 | Chi |
| 2012/0007664 A1 | 1/2012 | Chi |

OTHER PUBLICATIONS

Engdahl, Tomi, "Get power out of PC RS-232 port", Electronics Circuits Designed by Tomi Engdahl, (1997), pp. 1-6.

Elliott, Rod, "Balanced Line Driver & Receiver", Elliott Sound Products, Project 51, (1999), pp. 1-5.

International Search Report and Written Opinion of the International Searching Authority Dated Jun. 27, 2008, International Application No. PCT/US2007/023974.

International Search Report and Written Opinion of the International Searching Authority Dated Jun. 27, 2008, International Application No. PCT/US2007/024015.

International Search Report and Written Opinion of the International Searching Authority Dated Dec. 18, 2008, International Application No. PCT/US2008/011525.

* cited by examiner

SYSTEM AND METHOD FOR TERMINATION POWERED DIFFERENTIAL INTERFACE PERIPHERY

CROSS-REFERENCE TO RELATED APPLICATIONS

This application is a continuation of U.S. patent application Ser. No. 11/800,861, filed on May 7, 2007, now U.S. Pat. No. 8,175,555 which is incorporated herein by reference.

BACKGROUND OF THE INVENTION

1. Field of the Invention

The invention generally relates to the powering of peripheral devices through a remotely terminated differential driver load supply and more specifically to powering of peripheral circuits of an HDMI transmitter from the wasted power of the HDMI transmitter driver that is terminated at the receiver.

2. Prior Art

A typical high-definition multimedia interface (HDMI) transmission system 100 is shown in FIG. 1. The HDMI system has a source side driver 110 at the transmitter, with the drivers and the peripheral circuits, and a sink side termination 120 at the receiver. The twin differential drivers NL0 and NL1 of the source transmitter 115, driving the signal lines TXN and TXP respectively, are terminated through the termination resistors R0 and R1 connected to power supply at the receiver, or sink side termination 120. The termination is, for example, to the 3.3V nominal power supply per the HDMI specification. The transmitter drivers draw current from the receiver power supply through the termination resistors that enable the signal swing as per the HDMI specification. Since the drivers are differential, they draw a constant DC current and consume power. Part of the power that is consumed is in the switching of the differential drivers and the rest is used for setting up the DC conditions of the drivers with a fixed voltage and/or current. This part of the power is typically wasted.

In the prior art, the power supply to the peripheral circuits like pre-amplifier 111, phrase-locked loop PLL 112, serializer 113, and bias circuits 114, are from the power connection to the transmitter from an external supply.

In the case of the HDMI 1.2 standard, there are four transmission channels; each channel drawing 10.0 mA nominal current from the receiver's power supply. According to the HDMI specification, the signal swing across the load termination is 0.4 to 0.6 V which leaves 2.7 V out of the typical 3.3V supply. This power is currently dissipated in setting up the DC conditions of the drivers and hence, wasted. This power is available and can be tapped to power part of the peripheral circuits in the transmitter as disclosed in this disclosure.

BRIEF DESCRIPTION OF THE DRAWINGS

In order to better understand the principles of the disclosed invention the following drawings are provided. It should be noted that driver termination power supply, typically being 3.3V, is designated in the drawings as VDD. Transmitter periphery power supply is designated Vdd in the drawings.

DETAILED DESCRIPTION OF THE PREFERRED EMBODIMENTS

An apparatus and method for supplying power to the peripheral circuits of a transmitter circuit, especially a high-definition multimedia interface (HDMI) transmitter circuit, is disclosed. In an HDMI transmitter, the termination resistors of the output driver are part of the receiver. DC power for the differential output driver is supplied through these termination resistors. In prior art implementations, power supplied by the receiver circuit is wasted in setting the DC conditions of the differential output driver. It is suggested to use this wasted power from the remote termination to power selected peripheral circuits of the transmitter. The use of this wasted power of the line driver for powering the peripheral circuits reduces the total system power.

Figure 1:
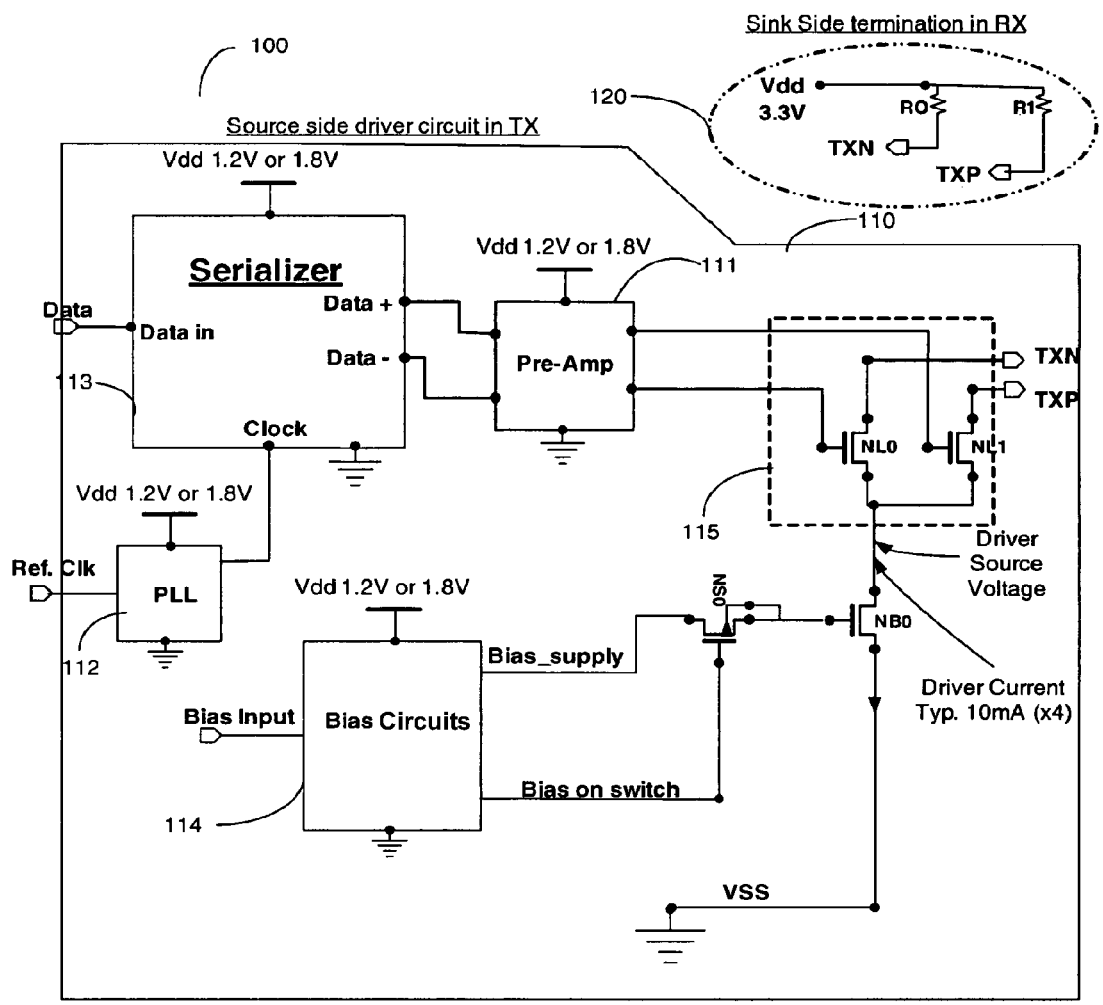
FIG. 1 is a block diagram of prior art HDMI driver with external power supply.
Figure 2:
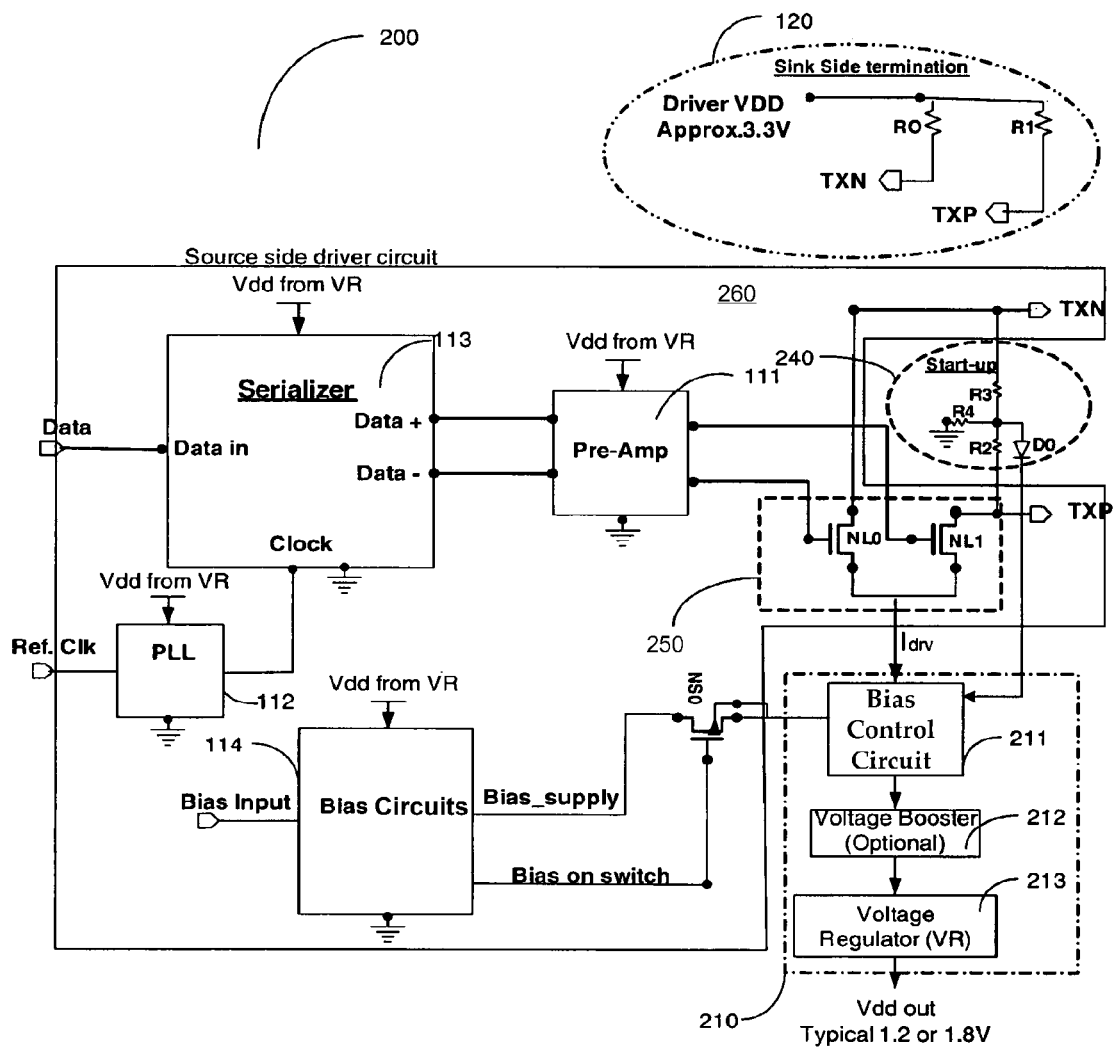
FIG. 2 is a block diagram showing an HDMI driver with power to peripherals supplied in accordance with the principles of the disclosed invention.

FIG. 2 is a non-limiting and exemplary HDMI video system 200 using the disclosed invention. The differential output drivers 250 have sink side termination 120, including resistors R0 and R1, at the receiver, connected to the receiver's power supply. In a typical HDMI implementation, the output swing specification is 0.4 to 0.6V. For the typical differential output driver 250 pair, the specified current drive is fixed at 10 mA from the nominal value of the power supply, typically at 3.3V. There are four driver pairs in a typical HDMI transmitter, for example, source side driver 260. Hence, for a 0.6V swing specification, the current source of the driver has to dissipate 40 mA×(Vdd-0.6V). Thus, a minimum 1.8 Volt supply capable of driving close to 40 mA is available at the interconnected source of the differential driver transistors, NS0 and NS1. This available power can be used to power the peripheral circuits through a recovered and regulated power supply of the disclosure, with no impact on the total power drain of the sink receiver. Using the recovered power supplied through the termination, reduces the power dissipation of the transmitter and hence, the total system. This supply voltage and current are regulated with circuitry 210, designed in accordance with the principles of the disclosed invention, to enable the utilization of this wasted power. The output of this circuit 210 is used to supply power to the standard peripheral circuits. In an embodiment of the current disclosure, it is proposed to use this available power source of the HDMI transmitter driver, for peripheral circuits like pre-amplifier 111, the PLL 112, the serializer 113 and the individual bias circuits 114 of the HDMI transmitter which require, for example, a 1.2 V supply. The use of this disclosed method of recovering wasted power can reduce the power requirements of the transmitter and hence, the total system power for a system comprising the transmitter and receiver.

In an exemplary and non-limiting case where the required supply is greater than 1.8V, it is still possible to use the wasted power with suitable voltage enhancing circuitry like a voltage booster 212. This is an optional element and can be eliminated when it is not required. The available current of this supply is the driver current and the available voltage is that at the interconnected source of the driver transistors, NS0 and NS1 of the differential output drivers 250. It is hence necessary to use external circuitry 210 having the voltage regulator 213 to regulate the voltage and bias control circuit 211 to sink the required total 40 mA required by the differential drivers, through the ground terminals of the peripheral devices powered by this supply.

Figure 3:
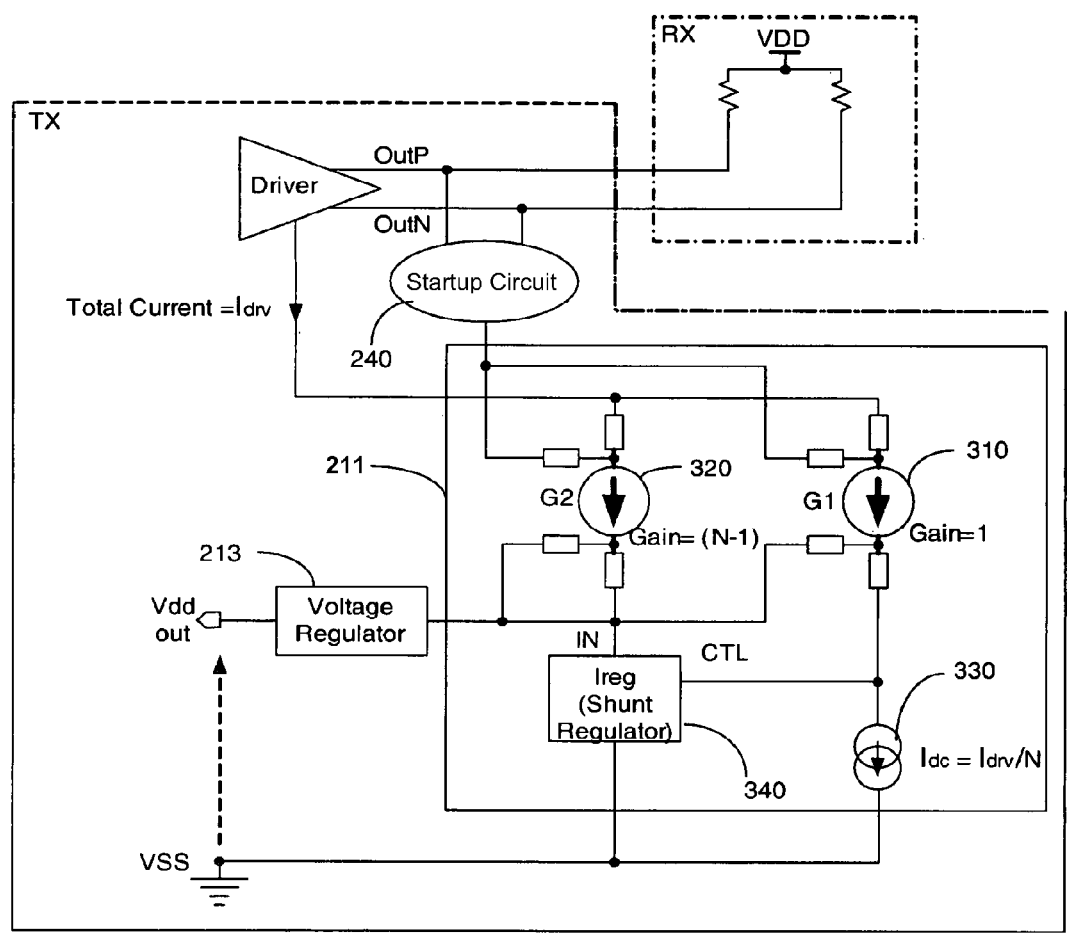
FIG. 3 is a schematic diagram showing the working principles of the disclosed invention.

Reference is now made to FIG. 3 that shows the principle of operation of the current invention. It is necessary for the driver current of the differential driver transistor pair comprising NS1 and NS2 to be at a pre-defined value, for example the value of 10 mA/pair, to adhere with the requirements of the HDMI specification. In order to achieve this, a bias control circuit 211 with current sensing elements and current control is used. This circuit functions as follows. Current sensing elements G1 310 and G2 320 are voltage controlled current sources with a gm proportional to 1 and N−1 providing a gm ratio of 1:N−1. Examples of G1 and G2 are MOSFET or BJT devices. It is possible to use more than two voltage controlled current sources, but at least two are necessary. The startup circuit 240 is necessary to enable the circuit to start operating when the output is connected and the termination is enabled. This startup circuit 240 taps or bleeds a small amount of power from the termination circuitry as soon as connection is made to the remote termination, to generate a Vbias voltage for G1 310 and initiate the operation of the bias control circuit 211. The voltage controlled current source G1 310 acts as a reference current sensor and control, with a fixed current source 330 of Idrv/N coupled to it. The voltage developed across the current source 330 is fed to the control pin, CTL of the shunt regulator 340. The shunt regulator 340 forces the voltage at its input pin, IN, to equal to that at its CTL pin by shunting the current through it. In doing so, the current passing through the shunt voltage controlled current source G2 320, will be equal to N−1 times the reference current in G1 310, which will be (N−1)*Idrv/N. Once the bias is operational, the startup circuit 240 is removed from the operation making the total current passing through the driver to be fixed at Idrv, from both the voltage controlled current sources together, enabling the full driver current. The current through G2 320, with the voltage at the source of the device G2 320, is then available as output of the bias control circuit 211, for use as supply voltage. After regulation by the voltage regulator 213, this recovered power, voltage and current, can be used to power the peripheral circuitry.

This voltage can also be boosted, if necessary, by the voltage booster 212, prior to regulation in the voltage regulator 213. This recovered and regulated supply voltage can then be used by any peripheral circuitry that requires higher than the voltage available at the source of the shunt voltage controlled current source G2 320.

A person skilled-in-the-art would readily appreciate that the invention disclosed herein is described with respect to specific embodiments. However, this should not be considered a limitation on the scope of the invention. Specifically, other implementations of the disclosed invention are envisioned and hence the invention should not be considered to be limited, for example, to HDMI compatible termination devices. Rather, the scope of the disclosed invention is as broad as its claims and the powered termination suggested herein may be used in other applications and configurations.

What is claim is:

1. A method for powering at least some peripheral circuits of a differential output driver of a transmitter comprising:
    recovering wasted power from driver circuits of the differential output driver of the transmitter;
    regulating the recovered power; and
    supplying the regulated power as voltage and current outputs to power at least a portion of the peripheral circuits of the differential output driver of the transmitter.

2. The method of claim 1, wherein the transmitter is an HDMI transmitter.

3. The method of claim 1, wherein using the recovered power for the peripheral circuits reduces the power consumption of the transmitter.

4. The method of claim 1, wherein the recovering wasted power comprises:
    recovering the wasted power of the driver circuits as supplied through termination resistors coupled to a supply voltage of a receiver.

5. The method of claim 4, wherein the receiver is an HDMI receiver.

6. The method of claim 4, wherein using the recovered power for the peripheral devices reduces the total power dissipation of a system comprising the transmitter and the receiver.

7. The method of claim 1, wherein the regulating of the recovered power further comprises:
    boosting the voltage of the recovered power for use by the peripheral circuits of the transmitter.

8. A power recovery circuit for powering at least some peripheral circuits of a differential output driver of a transmitter comprising:
    a bias control circuit that recovers wasted power from driver circuits of the differential output driver of the transmitter; and
    a voltage regulator having an input coupled to an output of the bias control circuit, the voltage regulator being configured to regulate the recovered wasted power to provide regulated power and being further configured to supply the regulated power as voltage and current outputs to power at least a portion of the peripheral circuits of the differential output driver of the transmitter.

9. The power recovery circuit of claim 8, wherein the transmitter is an HDMI transmitter.

10. The power recovery circuit of claim 8, wherein using the recovered wasted power for the peripheral circuits reduces the power consumption of the transmitter.

11. The power recovery circuit of claim 8, wherein the bias control circuit recovers the wasted power of the driver circuits as supplied through termination resistors coupled to a supply voltage of a receiver.

12. The power recovery circuit of claim 11 wherein the receiver is an HDMI receiver.

13. The power recovery circuit of claim 11 wherein using the recovered wasted power by the peripheral devices reduces the total power dissipation of a system comprising the transmitter and the receiver.

14. The power recovery circuit of claim 8 further comprising a voltage booster that steps up the voltage of the recovered wasted power for use by the peripheral circuits of the transmitter.

* * * * *